United States Patent
Shin et al.

(10) Patent No.: US 7,858,434 B2
(45) Date of Patent: Dec. 28, 2010

(54) ORGANIC THIN FILM TRANSISTOR SUBSTRATE AND METHOD OF MANUFACTURING THE SAME

(75) Inventors: Jung-Han Shin, Yongin-si (KR); Seon-Pil Jang, Seoul (KR); Min-Ho Yoon, Seoul (KR); Kyu-Young Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 12/196,990

(22) Filed: Aug. 22, 2008

(65) Prior Publication Data

US 2009/0057658 A1   Mar. 5, 2009

(30) Foreign Application Priority Data

Aug. 30, 2007   (KR) ............... 10-2007-0087450

(51) Int. Cl.
*H01L 21/00* (2006.01)
(52) U.S. Cl. .............. 438/99; 438/158; 257/E21.535
(58) Field of Classification Search ............ 438/99; 257/E21.535
See application file for complete search history.

(56) References Cited

U.S. PATENT DOCUMENTS

2005/0266693 A1* 12/2005 Maekawa ............... 438/720
2007/0040171 A1*  2/2007 Kim et al. ............... 257/57

FOREIGN PATENT DOCUMENTS

| JP | 2006-186148 | 7/2006 |
|---|---|---|
| KR | 2004-0059093 | 7/2004 |
| KR | 2004-0089840 | 10/2004 |
| KR | 2005-0068308 | 7/2005 |

* cited by examiner

*Primary Examiner*—Chandra Chaudhari
(74) *Attorney, Agent, or Firm*—Innovation Counsel LLP

(57) ABSTRACT

An organic thin film transistor substrate includes a substrate, a gate line on a surface of the substrate, a gate insulating layer insulating on the gate line, a data line on the gate insulating layer, an organic thin film transistor connected to the gate line and the data line, the organic thin film transistor including an organic semiconductor layer, a bank-insulating layer positioned at least in part on the data line, the bank-insulating layer including a wall portion which defines a pixel area, and a pixel electrode formed in the pixel area.

7 Claims, 11 Drawing Sheets

ORGANIC THIN FILM TRANSISTOR SUBSTRATE AND METHOD OF MANUFACTURING THE SAME

CROSS-REFERENCE TO RELATED APPLICATIONS

This application claims priority to and the benefit of Korean Patent Application No. 10-2007-0087450, filed in the Korean Intellectual Property Office on Aug. 30, 2007, the entire disclosure of which is incorporated herein by reference.

BACKGROUND

1. Field of the Invention

This invention relates to an organic thin film transistor ("TFT") substrate, and more particularly, to an imprint-type organic TFT substrate and a method of manufacturing the same.

2. Description of the Related Art

With the rapid development of the information society, liquid crystal display ("LCD") devices are widely used for information display. The LCD device has increasingly been used in a broad range of applications because the LCD device is lightweight, compact, and consumes a relatively low amount of power. The LCD includes an LCD panel having liquid crystal cells arranged in a matrix, wherein the cells control light transmittivity as a function of a scan signal, thereby displaying images.

A thin film transistor ("TFT") is used as a switching element for independently supplying a scan signal to an associated liquid crystal cell. A morphous silicon or polycrystalline silicon is typically used as an active layer of the TFT. Recently an organic TFT using an organic semiconductor has been used instead of an inorganic semiconductor such as silicon, is being actively conducted.

An organic TFT substrate is manufactured using a plurality of mask processes. One mask process includes, for example, a plurality of processes such as a thin film deposition process, a cleaning process, a photolithography process, an etching process, a photoresist striping process, and an inspecting process.

The photolithography process includes photoresist deposition, mask alignment, exposure, development, and stripping. The photolithography process is lengthy and requires a substantial amount of stripping solution to remove the photoresist. As the size of the substrate becomes larger and the size of the pattern becomes smaller, the cost of the photolithography process has increased.

BRIEF SUMMARY

The present invention provides an organic TFT substrate and a method of manufacturing the organic TFT substrate, capable of shortening a manufacturing time and reducing manufacturing costs by forming the organic TFT substrate by an imprint method without using masks.

An exemplary embodiment of the present invention provides an organic thin film transistor substrate, including a substrate, a gate line on a surface of the substrate, a gate insulating layer insulating on the gate line, a data line on the gate insulating layer, an organic thin film transistor connected to the gate line and the data line, the organic thin film transistor including an organic semiconductor layer, a bank-insulating layer positioned at least in part on the data line, the bank-insulating layer including a wall portion which defines a pixel area, and a pixel electrode formed in the pixel area.

Another exemplary embodiment of the present invention provides a method of manufacturing an organic thin film transistor substrate, including forming a gate metal pattern including a gate electrode on a substrate, forming a gate insulating layer and a data metal pattern, the data metal pattern including a source electrode and a drain electrode, wherein the forming includes using a first imprint mold having a stepped height, forming a bank-insulating layer having a stepped height on the gate insulating layer and the data metal pattern by using a second imprint mold having a stepped height, and forming a pixel electrode within an area defined by the bank-insulating layer.

A better understanding of the above and many other features and advantages of the organic thin film transistor substrates and methods for making them disclosed herein may be obtained from a consideration of the detailed description thereof below, particularly if such consideration is made in conjunction with the several views of the appended drawings, wherein like elements are referred to by like reference numerals throughout.

DETAILED DESCRIPTION

Figure 1:
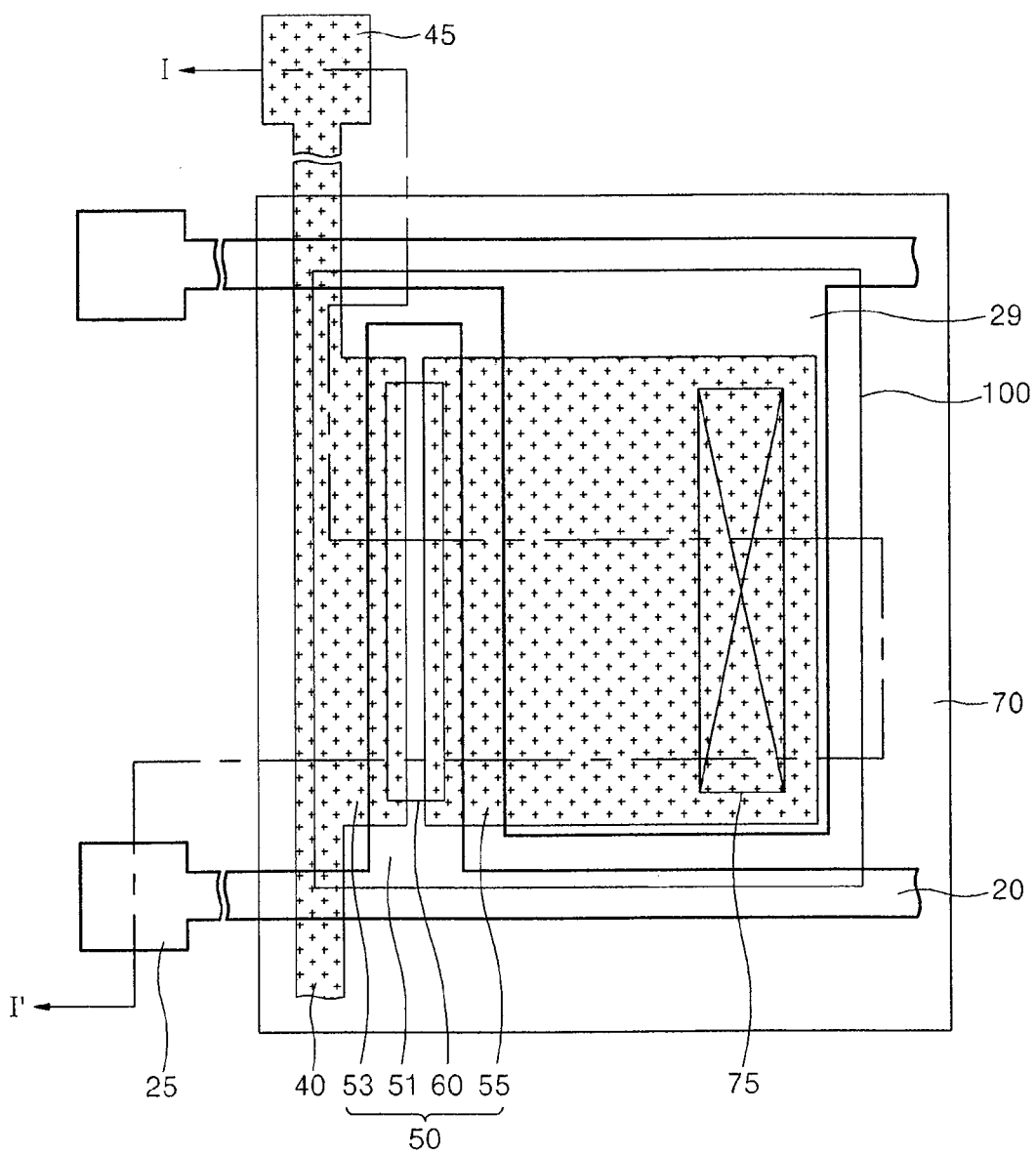
FIG. 1 is a plan view showing an organic TFT substrate according to an exemplary embodiment of the present invention.
Figure 2:
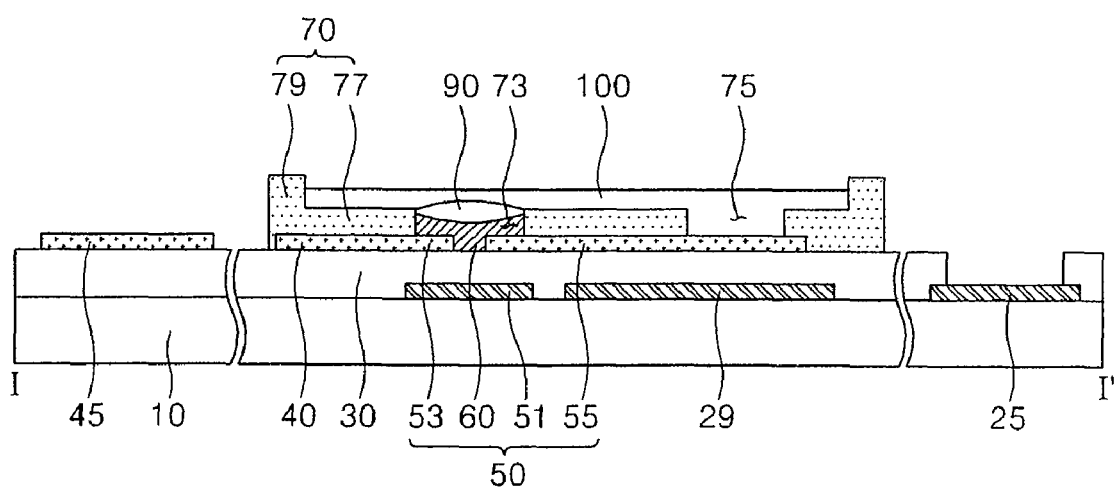
FIG. 2 is a cross-sectional view taken along line I-I' shown in FIG. 1.

FIG. 1 is a plan view showing an organic TFT substrate according to an exemplary embodiment of the present invention, and FIG. 2 is a cross-sectional view taken along line I-I' shown in FIG. 1.

Referring to FIGS. 1 and 2, an organic TFT substrate 150 includes a gate pad electrode 25, a data pad electrode 45, a gate line 20, a data line 40, a gate insulating layer 30, a storage electrode 29, an organic TFT 50, a bank-insulating layer 70, an organic protective layer 90, and a pixel electrode 100.

The gate pad electrode 25 and the data pad electrode 45 are formed in a non-display area. The gate line 20, the data line 40, the gate insulating layer 30, the storage electrode 29, the organic TFT 50, the bank-insulating layer 70, the organic protective layer 90, and the pixel electrode 100 are formed in a display area.

The gate pad electrode 25 is connected to the gate line 20 and receives a scan signal from a gate driver (not shown). The gate pad electrode 25 supplies the scan signal to the gate line 20. The gate pad electrode 25 is formed on a substrate 10 which can be glass or plastic.

The data pad electrode 45 is connected to the data line 40 and receives a pixel voltage signal from a data driver (not shown). The data pad electrode 45 supplies the pixel voltage signal to the data line 40. The data pad electrode 45 is formed on the gate insulating layer 30.

The gate line 20 is formed on the substrate 10 and receives the scan signal from the gate pad electrode 25. The gate line 20 is formed of a metallic material in a single layer structure or in a multi-layered structure. The metallic material may be one of molybdenum (Mo), niobium (Nb), copper (Cu), aluminum (Al), chrome (Cr), silver (Ag), and tungsten (W), or a combination of these metals.

The data line 40 receives the pixel voltage signal from the data pad electrode 45. The data line 40 crosses the gate line 20 with the gate insulating layer 30 disposed therebetween. The data line 20 may be formed in a single layer structure of a metallic material such as Al, Cr, Ag, or W, or in a multi-layered structure of a combination of these metals.

The gate insulating layer 30 is formed between the gate line 20 and the data line 40 and insulates a gate metal pattern including the gate line 20 from a data metal pattern including the data line 40. The gate insulating layer 30 exposes the gate pad electrode 25. The gate insulating layer 30 may be formed of an organic material such as polyimide, polyvinyl alcohol, polyfluorane, or parylene. Alternatively, the gate insulating layer 30 may be an inorganic material such as silicon oxide that is surface-treated by octadecyl trichlorosilane (OTS).

The storage electrode 29 is formed of the same material as that of the gate line 20 on the substrate 10. The storage electrode 29 overlaps a drain electrode 55 of the organic TFT 50 with the gate insulating layer 30 disposed therebetween to form a storage capacitor.

The organic TFT 50 causes the pixel voltage signal supplied to the data line 40 to be charged in the pixel electrode 100 in response to the scan signal supplied to the gate line 30. The organic TFT 50 includes a gate electrode 51 connected to the gate line 30, a source electrode 53 connected to the data line 40, and the drain electrode 55 that faces the source electrode 53 and is connected to the pixel electrode 100.

The organic TFT 50 also includes an organic semiconductor layer 60 that overlaps the gate electrode 51 with the gate insulating layer 30 disposed therebetween and forms a channel between the source electrode 53 and the drain electrode 55. The organic semiconductor layer 60 is formed to contact the source electrode 53 and the drain electrode 55 in a region where the organic semiconductor layer 60 overlaps the gate electrode 51. The organic semiconductor layer 60 may be formed of an organic insulating material, such as polyvinylacetate (PVA), pentacene, tetracene, anthracene, naphthalene, α-6T, α-4T, perylene and its derivatives, rubrene and its derivatives, coronene and its derivatives, perylene tetracarboxylic diimide and its derivatives, perylenetetracarboxylic dianhydride and its derivatives, phthalocyanine and its derivatives, naphthalene tetracarboxylic diimide and its derivatives, naphthalene tetracarboxylic dianhydride and its derivatives, conjugated polymer derivatives including substituted or non-substituted thiophene, or conjugated polymer derivatives including substituted fluorene.

The bank-insulating layer 70 may be formed of, for example, a photosensitive organic material. A first contact hole 73 and a second contact hole 75 are formed in the bank-insulating layer 70. The first contact hole 73 provided by the bank-insulating layer 70 receives and contains the organic semiconductor layer 60. Parts of the source electrode 53 and drain electrode 55 contact the organic semiconductor layer 60 through the first contact hole 73. A part of the drain electrode 55 is connected to the pixel electrode 100 through the second contact hole 75 provided by the first bank-insulating layer 70. The bank-insulating layer 70 includes barrier/wall 79 and a supporting layer 77. The barrier 79 is formed on the data line 40. The barrier 79 defines a pixel area with surrounding an outer surface of the pixel electrode 100 to divide areas where the pixel electrode 100 is to be formed. The supporting layer 77 which includes the first contact hole 73 and the second contact hole 75 has a height lower than the barrier 79.

The organic protective layer 90 protects the organic TFT 50. The organic protective layer 90 is formed within the first contact hole 73 provided by the bank-insulating layer 70. In other words, the organic protective layer 90 is formed on the organic semiconductor layer 60 formed within the first contact hole 73. The organic protective layer 90 may be formed one of benzocyclobutene (BCB), acryl-based organic compound, fluoropolyarrylether (FPAE), perfluorocyclobutene (PFCB), and cytop.

The pixel electrode 100 is formed in the pixel area which is defined by the barrier 79 of the bank-insulating layer 70. The pixel electrode 100 is connected to the drain electrode 55 through the second contact hole 75 provided by the bank-insulating layer 70. Hence, the pixel electrode 100 receives the pixel voltage signal from the drain electrode 55 to control pixels. The pixel electrode 100 may be formed of a transparent conductive material or a reflective conductive material. The transparent conductive material may be for example indium tin oxide (ITO), tin oxide (TO), indium zinc oxide (IZO), or indium tin zinc oxide (ITZO).

A method of manufacturing an organic TFT substrate according to the present invention is described below in detail with reference to FIGS. 3 to 14.

Figure 3:
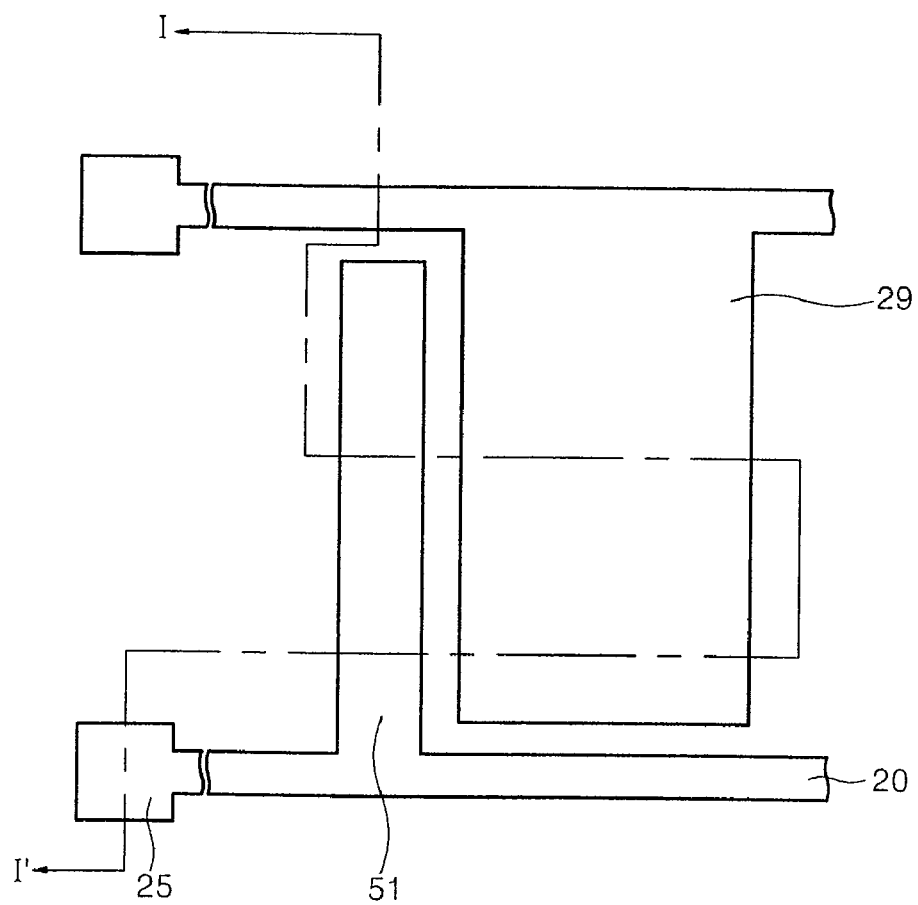
FIGS. 3 and 4 are plan view and cross-sectional views, respectively, showing a gate metal pattern forming process in a method of manufacturing an organic TFT substrate according to an exemplary embodiment of the present invention.
Figure 4:
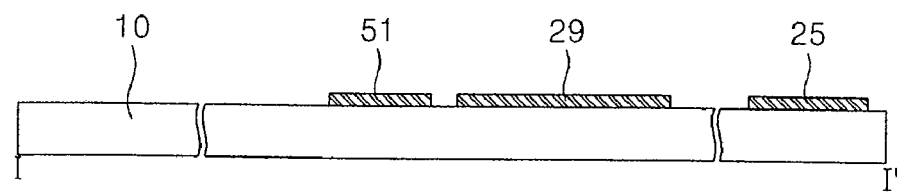

FIGS. 3 and 4 are plan view and cross-sectional views, respectively, showing a gate metal pattern forming process in a method of manufacturing an organic TFT substrate according to an exemplary embodiment of the present invention;

Referring to FIGS. 3 and 4, a gate metal pattern is formed including a gate line 20, a gate electrode 51, a gate pad electrode 25, and a storage electrode 29. More specifically, a gate conductive layer is formed on a glass or plastic substrate 10 by a deposition method such as sputtering. The gate conductive layer may be formed in a single layer structure including any one of Mo, Nb, Cu, Al, Cr, Ag, and W, or in a multi-layered structure including a combination of these metals. Next, an imprint mold is disposed on the gate conductive layer. The gate conductive layer is patterned by pressing the imprint mold, thereby forming the gate metal pattern including the gate line 20, the gate electrode 51, the gate pad electrode 25, and the storage electrode 29. The gate metal pattern may be formed by a mask process including a photolithographic process instead of the imprint method.

Figure 6:
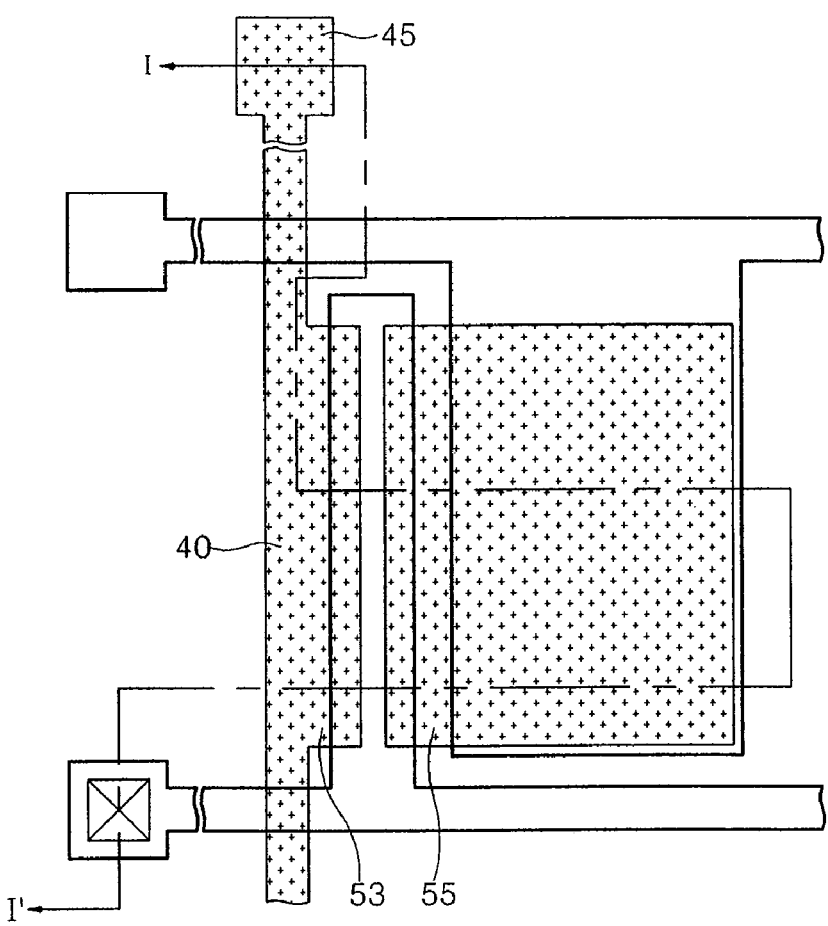
FIGS. 6 and 7 are plan view and cross-sectional views, respectively, showing an organic TFT substrate after the gate insulating layer forming process and the data metal pattern forming process are completed.
Figure 7:
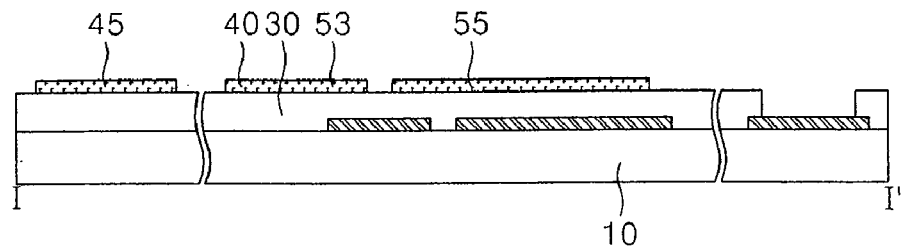

FIGS. 5A to 5F are cross-sectional views showing a gate insulating layer forming process and a data metal pattern forming process in a method of manufacturing an organic TFT substrate according to an exemplary embodiment of the present invention. FIGS. 6 and 7 are plan view and cross-sectional views, respectively, showing an organic TFT substrate after the gate insulating layer forming process and the data metal pattern forming process are completed.

Figure 5A:
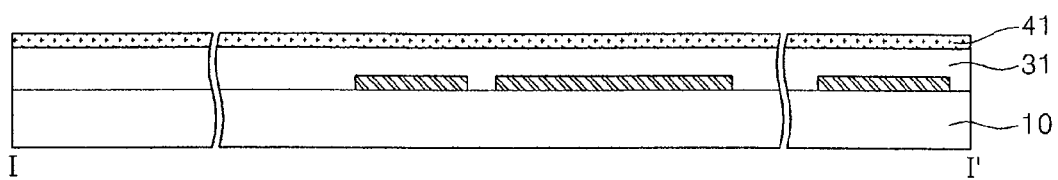
FIGS. 5A to 5F are cross-sectional views showing a gate insulating layer forming process and a data metal pattern forming process in a method of manufacturing an organic TFT substrate according to an exemplary embodiment of the present invention.

Referring to FIG. 5A, an insulating layer 31 and a data conductive layer 41 are formed on the substrate 10 on which the gate metal pattern is formed. More specifically, an insulating material is deposited on the substrate 10 on which the gate metal pattern is formed by a deposition method such as plasma enhanced chemical vapor deposition ("PECVD") to form the insulating layer 31. Thereafter, the data conductive layer 41 is formed by depositing a metallic material such as Al, Cr, or Ag.

Figure 5B:
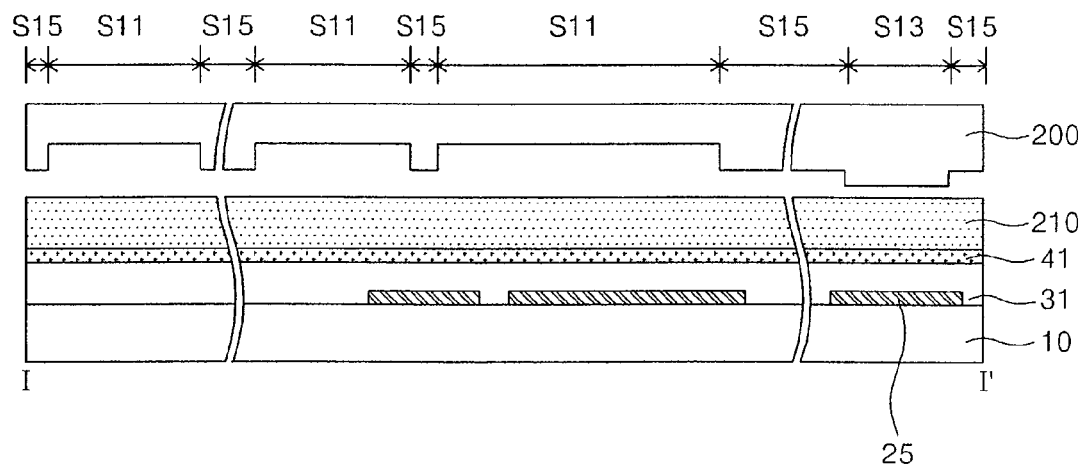
Figure 5C:
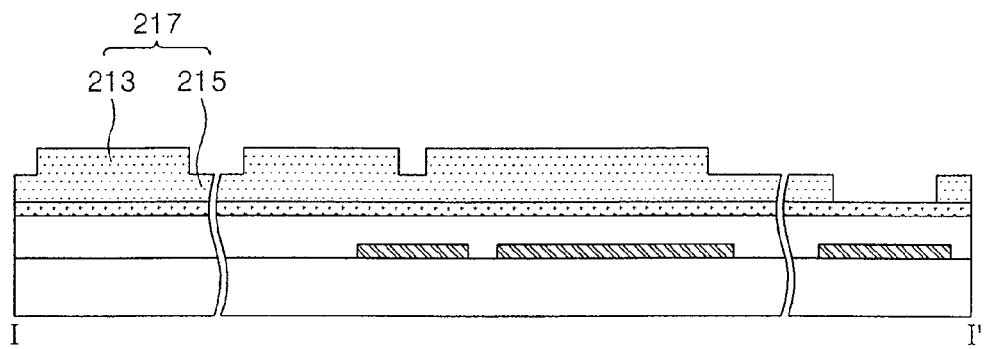

Referring to FIGS. 5B and 5C, a photoresist layer 210 is formed on the substrate 10 on which the insulating layer 31 and the data conductive layer 41 are formed and a first imprint mold 200 is disposed on the photoresist layer 210. A photoresist pattern 217 having different thicknesses is formed by pressing the photoresist layer 210 by means of the first imprint mold 200.

More specifically, the photoresist layer 210 made of a photosensitive organic material is formed on the substrate 10 on which the insulating layer 31 and the data conductive layer 41 are formed. Next, the first imprint mold 200 having a stepped height is arranged on the photoresist layer 210. The first imprint mold 200 includes a first area S11 having the thinnest thickness, a second area S13 having the thickest thickness, and a third area S15 thicker than the first area S11 and thinner than the second area S13. The first area S11 is disposed in an area where the data metal pattern is to be formed, the second area S13 is disposed in an area where the gate pad electrode 25 is to be formed, and the third area S15 is disposed in an area where the data conductive layer 41 is to be eliminated. The photoresist layer 210 is pressed by the first imprint mold 200 to form the photoresist pattern 217 having different thicknesses. A first photoresist pattern 213 pressed in the first area S11 by the first imprint mold 200 is relatively thick. A photoresist pattern 215 pressed in the third area S15 by the first imprint mold 200 is relatively thin. The photoresist pattern 217 pressed in the second area S13 by the first imprint mold 200 is removed. Thereafter, the first imprint mold 200 is removed.

Figure 5D:
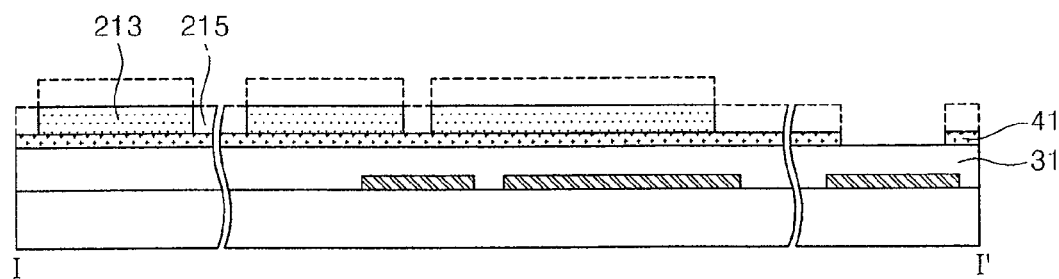

Referring to FIG. 5D, the portion of data conductive layer 41 exposed by the removed photoresist pattern in FIG. 5C is eliminated by a first etching process using the first and second photoresist pattern portions 213 and 215 as a mask, and thus the insulating layer 31 formed under the removed data conductive layer 41 is exposed. Next, the first photoresist pattern 213 is reduced in thickness by an etching process such as oxygen plasma, and the second photoresist pattern portion 215 is removed.

Figure 5E:
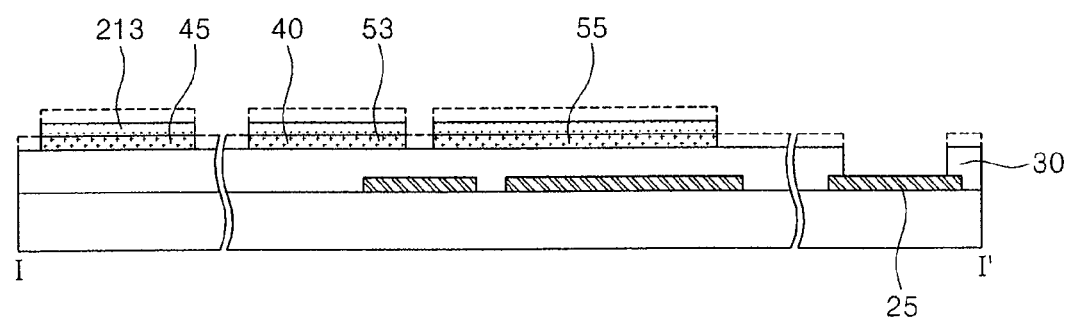

Referring to FIG. 5E, the insulating layer 31 formed on the gate pad electrode 25 is removed by a second etching process using the data conductive layer 41 as a mask and the data conductive layer 41 is patterned by a third etching process using the first photoresist pattern 213 as a mask, thereby forming the data pad electrode 45, the data line 40, the source electrode 53, the drain electrode 55, and the gate insulating layer 30. The first photoresist pattern 213 is reduced in thickness by an etching process such as oxygen plasma.

Figure 5F:
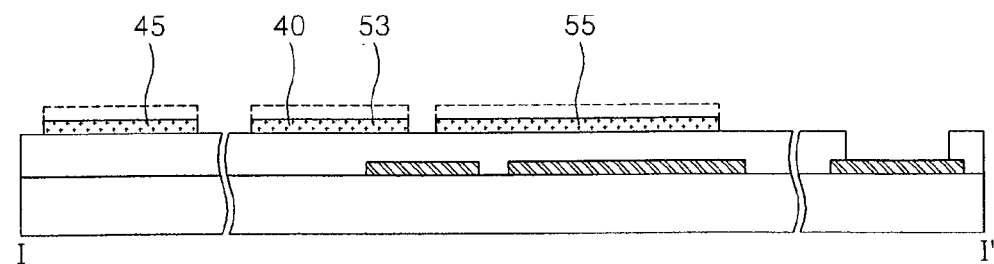

Referring to FIG. 5F, the first photoresist pattern 213 remaining on the data metal pattern is removed by an etching process such as, for example, by oxygen plasma.

Thus the data metal pattern including the data line 40, the source electrode 53, the drain electrode 55, and the data pad electrode 45 is formed on the gate insulating layer 30, as shown in FIGS. 6 and 7.

Figure 9:
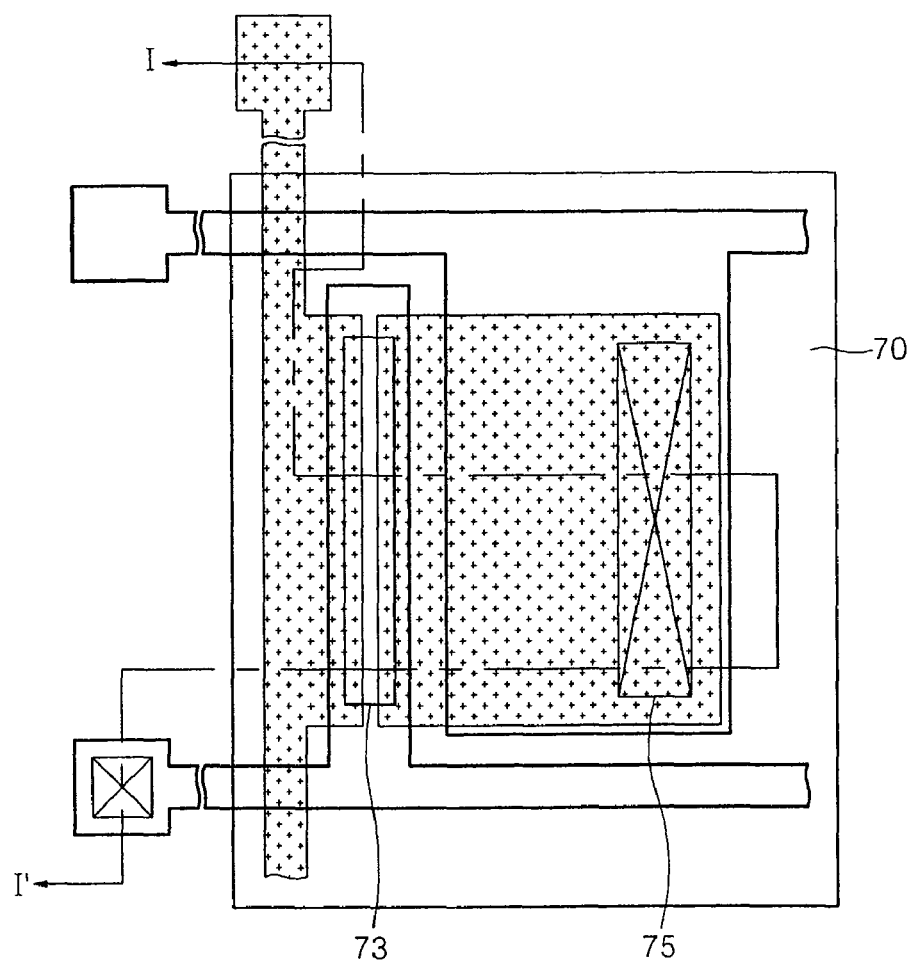
FIGS. 9 and 10 are plan view and cross-sectional views, respectively, showing an organic TFT substrate after the bank-insulating layer is formed.
Figure 10:
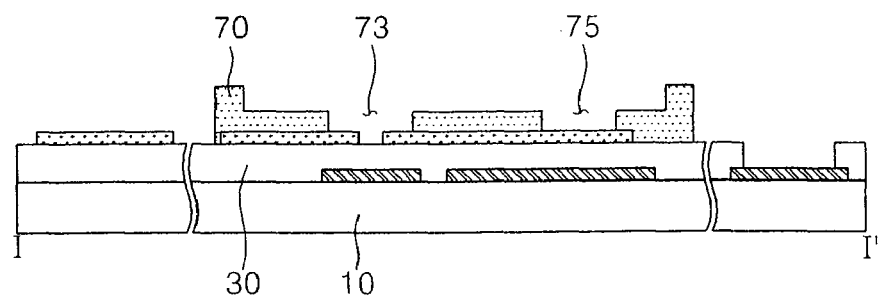

FIGS. 8A to 8E are cross-sectional views showing a bank-insulating layer forming process in a method of manufacturing an organic TFT substrate according to an exemplary embodiment of the present invention. FIGS. 9 and 10 are plan view and cross-sectional views, respectively, showing an organic TFT substrate after the bank-insulating layer is formed.

Figure 8A:
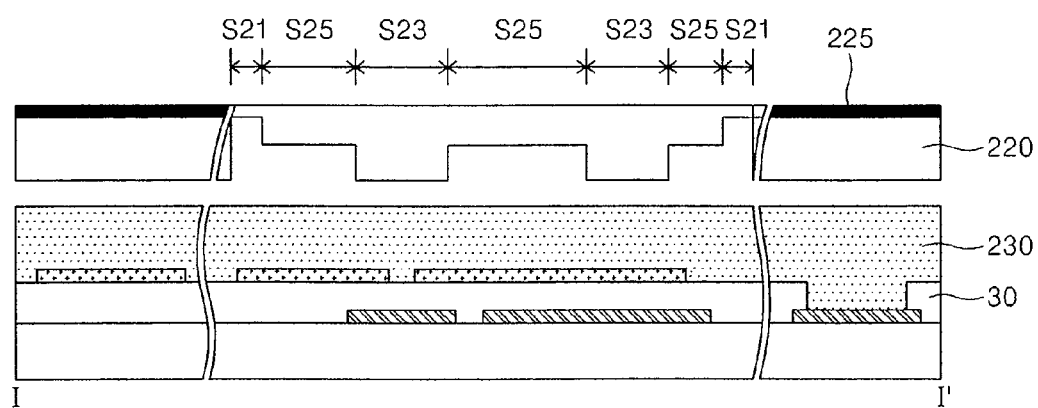
FIGS. 8A to 8E are cross-sectional views showing a bank-insulating layer forming process in a method of manufacturing an organic TFT substrate according to an exemplary embodiment of the present invention.

Referring to FIG. 8A, an organic insulating layer 230 is formed on the substrate 10 on which the gate insulating layer 30 and the data metal pattern are formed, and a second imprint mold 220 including a shielding layer 225 is disposed on the organic insulating layer 230.

More specifically, the organic insulating layer 230 is formed by a deposition method such as PECVD on the substrate 10 on which the gate insulating layer 30 and the data metal pattern are formed. Thereafter, the second imprint mold 220 that has stepped height and includes the shielding layer 225 is disposed on the organic insulating layer 230. The light shielding layer 225 is located in a non-display area, that is, an area where the gate pad electrode 25 and the data pad electrode 45 are formed. The shielding layer 225 is formed on the second imprint mold 220. The light shielding layer 225 prevents light from transferring to an external region of a bank-insulating layer out of the organic insulating layer 230. The second imprint mold 220 includes a first area S21 having the thinnest thickness, a second area S23 having the thickest thickness, and a third area S25 thicker than the first area S21 and thinner than the second area S23. The first area S21 and the third area S25 are disposed in an area where the bank-insulating layer is to be formed. The second area S23 is disposed in an area where the organic insulating layer 230 is to be eliminated and first and second contact holes are to be formed. The organic insulating layer 230 is pressed by the second imprint mold 220 to form a bank-insulating pattern.

Figure 8B:
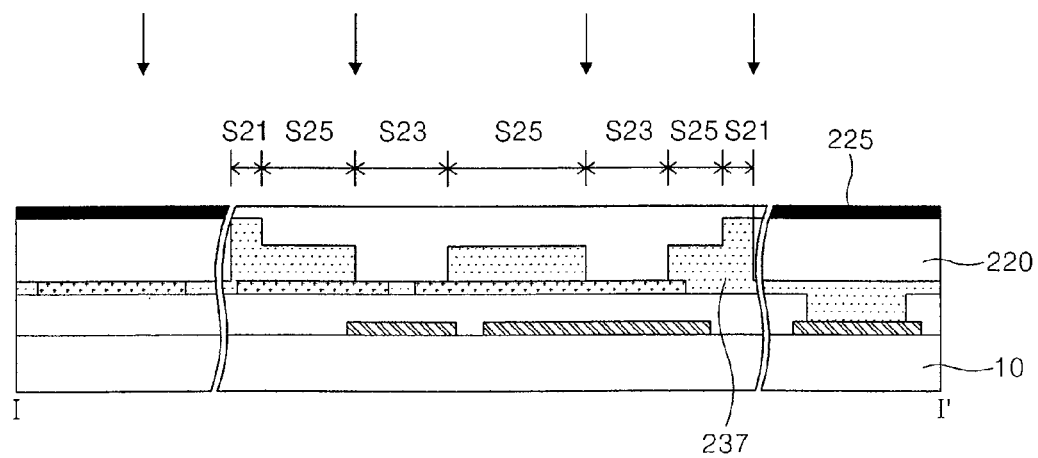

Referring to FIG. 8B, light is irradiated onto the substrate 10 on which a bank-insulating pattern 237 is formed under the state that the second imprint mold 220 is pressed. Then the bank-insulating pattern 237 formed in the first area S21, the second area S23 and the third area S25 of the second imprint mold 220 is hardened. Meanwhile, the bank-insulating pattern 237 formed in the non-display area is not hardened because light is cut off by the shielding layer 225.

Figure 8C:
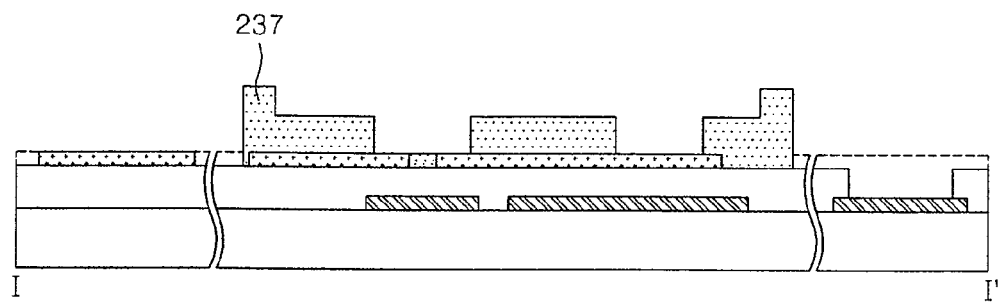

Referring to FIG. 8C, the second imprint mold 220 is removed and the bank-insulating pattern 237 that is formed in the non-display area and is not hardened is eliminated. Since the bank-insulating pattern 237 formed under the shielding layer 225 is not hardened by the shielding layer 225, the bank-insulating pattern 237 can be easily removed.

Figure 8D:
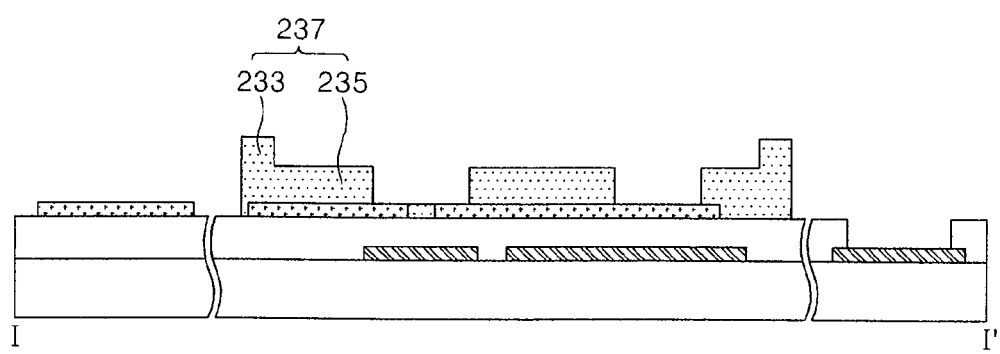

Then the bank-insulating pattern 237 having different thickness remains as shown in FIG. 8D. The bank-insulating pattern 237 includes a first bank-insulating pattern 233 that is formed in an area where a barrier of the bank-insulating layer is to be formed and a second bank-insulating pattern 235 that has thinner thickness than the first bank-insulating layer and is formed in an area where the supporting layer of the bank-insulating layer is to be formed.

Figure 8E:
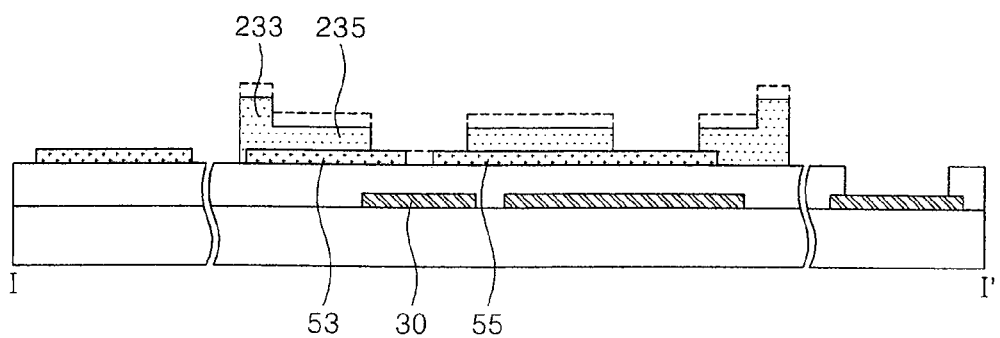

Referring to FIG. 8E, the first bank-insulating pattern 233 and the second bank-insulating pattern 235 are thinned by an etching process using oxygen plasma and the gate insulating layer 30 formed between the source electrode 53 and the drain electrode 55 is exposed.

Then a bank-insulating layer 70 including first and second contact holes 73 and 75 is formed on the substrate 10 on which the gate insulating layer 30 and the data metal pattern are formed, as shown in FIGS. 9 and 10.

Figure 11:
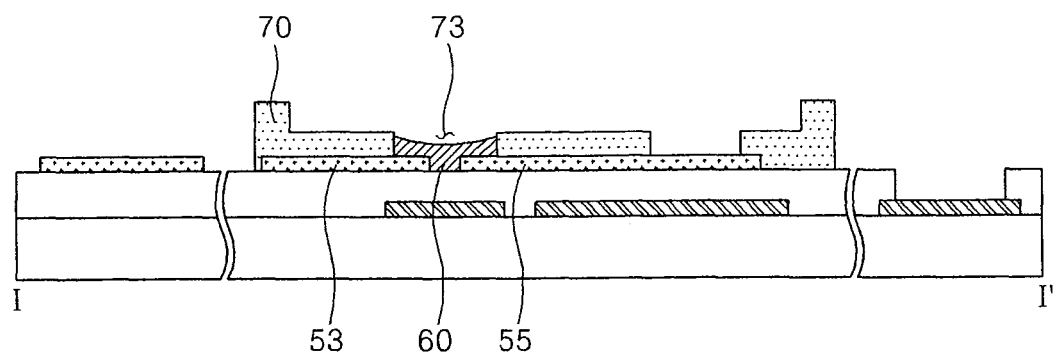
FIG. 11 is a cross-sectional view showing an organic semiconductor layer forming process in a method of manufacturing an organic TFT substrate according to an exemplary embodiment of the present invention.

FIG. 11 is a cross-sectional view showing an organic semiconductor layer forming process in a method of manufacturing an organic TFT substrate according to an exemplary embodiment of the present invention.

Referring to FIG. 11, an organic semiconductor layer 60 is formed on the source electrode 53 and the drain electrode 55 that are exposed by the first contact hole 73. More specifically, an organic semiconductor of a liquid state is jetted into the first contact hole 73 provided by the bank-insulating layer 70 by means of an inkjet nozzle. The organic semiconductor of a liquid state is hardened, thereby forming the organic semiconductor layer 60. The organic semiconductor layer 60 is subject to self assembled monolayer ("SAM") processing. Then the organic semiconductor layer 60 directly contacts the source electrode 53 and the drain electrode 55.

Figure 12:
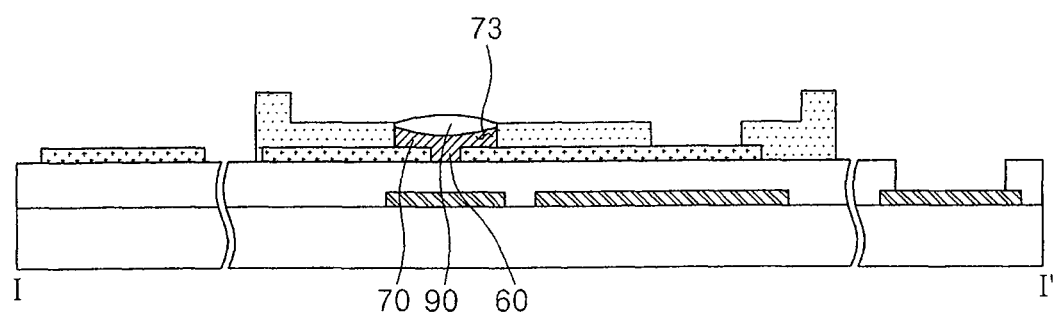
FIG. 12 is a cross-sectional view showing an organic protective layer forming process in a method of manufacturing an organic TFT substrate according to an exemplary embodiment of the present invention.

FIG. 12 is a cross-sectional view showing an organic protective layer forming process in a method of manufacturing an organic TFT substrate according to an exemplary embodiment of the present invention.

Referring to FIG. 12, an organic protective layer 90 is formed within the first contact hole 73 in which the organic semiconductor layer 60 is formed. The organic protective layer 90 is formed by jetting an organic insulating material of a liquid state such as polyvinylacetate (PVA) through an inkjet nozzle within the first contact hole 73 in which the organic semiconductor layer 60 is formed.

Figure 13:
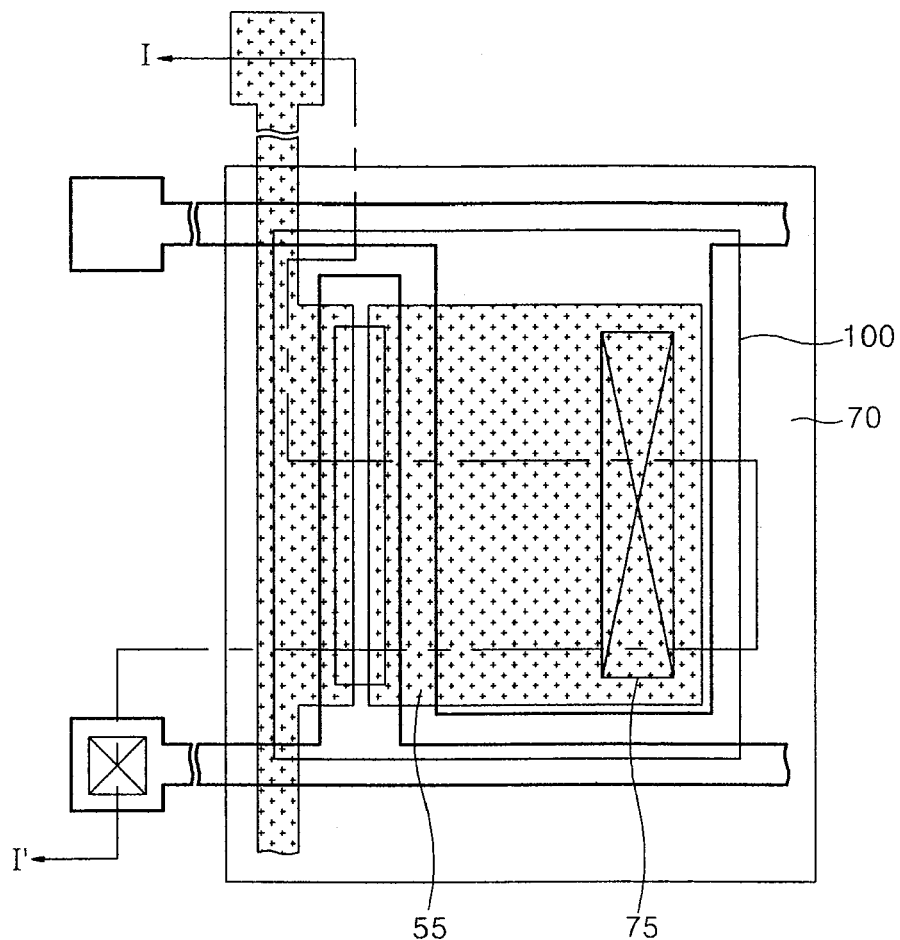
FIGS. 13 and 14 are plan view and cross-sectional views, respectively, showing a pixel electrode forming process in a method of manufacturing an organic TFT substrate according to an exemplary embodiment of the present invention.
Figure 14:
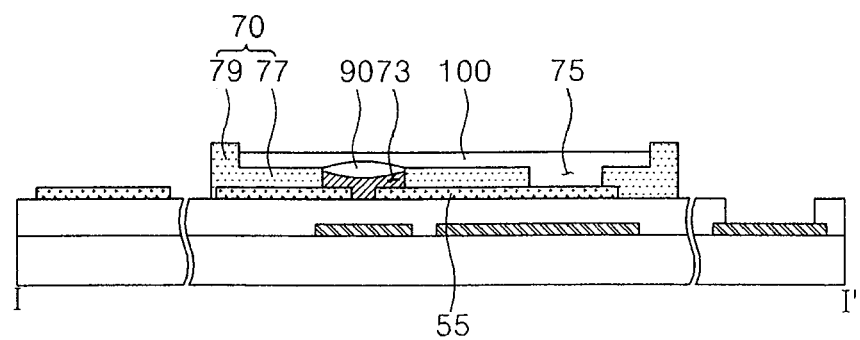

FIGS. 13 and 14 are plan view and cross-sectional views, respectively, showing a pixel electrode forming process in a method of manufacturing an organic TFT substrate according to an exemplary embodiment of the present invention.

Referring to FIGS. 13 and 14, a pixel electrode 100 is formed in an area formed by a barrier 79 of the bank-insulating layer 70. More specifically, a transparent conductive material of a liquid state, such as ITO, IZO, TO and ITZO, is jetted through an inkjet nozzle on a supporting layer 77, the organic protective layer 90 formed within the first contact hole 73, and the second contact hole 75 exposing a drain electrode 55. The transparent conductive material of a liquid state is hardened to form the pixel electrode 100. The pixel electrode 100 is connected to the drain electrode 55 through the second contact hole 75.

As described above, an organic TFT substrate and a method of manufacturing the organic TFT substrate form a pattern of the organic TFT substrate by using an imprint method. Since masks are not used, manufacturing time is shortened and manufacturing costs are reduced.

Although the present invention has been described with reference to certain exemplary embodiments thereof, it will be understood by those of skill in this art that a variety of modifications and variations may be made to the present invention without departing from the spirit and scope of the present invention as defined in the appended claims and their functional equivalents.

What is claimed is:

1. A method of manufacturing an organic thin film transistor substrate, comprising:
    forming a gate metal pattern including a gate electrode on a surface of a substrate;
    forming a gate insulating layer and a data metal pattern, the data metal pattern including a data line, a source electrode, a drain electrode, a data pad electrode, wherein the forming includes using a first imprint mold having a stepped height;
    forming a bank-insulating layer having a stepped height on the gate insulating layer and the data metal pattern by using a second imprint mold having a stepped height; and
    forming a pixel electrode within an area defined by the bank-insulating layer,
    wherein the forming of the gate insulating layer and the data metal pattern comprises:
    forming an insulating layer and a data conductive layer by sequentially depositing an insulating material and a metallic material on the gate insulating layer;
    forming a photoresist layer comprised of a photosensitive organic material on the data conductive layer;
    disposing the first imprint mold on the photoresist layer;
    establishing in the photoresist layer a photoresist pattern having a plurality of thicknesses by pressing the first imprint mold against the photoresist layer;
    removing the first imprint mold; and
    exposing the gate pad electrode, by etching the insulating layer and the data conductive layer using the photoresist pattern, and forming the data line, the source electrode, the drain electrode, and the data pad electrode by patterning the data conductive layer.

2. The method of claim 1, wherein forming a gate metal pattern comprises forming the gate metal pattern including a gate line, the gate electrode, a storage electrode, and a gate pad electrode on the substrate.

3. The method of claim 1, wherein the forming of the photoresist pattern having a different thicknesses comprises:
    forming a first photoresist pattern having a first thickness in an area where the data metal pattern is to be formed; and
    forming a second photoresist pattern having a second thickness in an area where the data conductive layer is to be eliminated, wherein the first thickness is thicker than the second thickness.

4. The method of claim 1, wherein the forming a bank-insulating layer comprises:
    forming an organic insulating layer formed of a photosensitive organic material on the gate insulating layer and the data metal pattern;
    a disposing the second imprint mold having a stepped height and including a shielding layer shielding light transmitted outside the bank-insulating layer out of the organic insulating layer;
    forming a bank-insulating pattern having a steppe height by pressing the organic insulating layer by the second imprint mold;
    hardening the bank-insulating pattern by irradiating light onto the second imprint mold;
    eliminating the bank-insulating pattern formed under the shielding layer;
    forming a first contact hole exposing the source electrode and the drain electrode and a second contact hole exposing the drain electrode, by etching the bank-insulating pattern; and
    forming the bank-insulating layer including a barrier dividing an area where the pixel electrode is to be formed.

5. The method of claim 1, wherein the forming a pixel electrode comprises forming an organic semiconductor layer, an organic protective layer, and the pixel electrode within the area divided by the bank-insulating layer.

6. The method of claim 5, wherein the forming a pixel electrode comprises:
    forming the organic semiconductor layer by depositing an organic semiconductor material in a first contact hole of the bank-insulating layer;

forming the organic protective layer by depositing an organic insulating material on the organic semiconductor layer; and forming the pixel electrode by depositing a transparent conductive material in an area divided by a barrier of the bank-insulating layer.

7. The method of claim 1, wherein the bank-insulating layer comprises a barrier by which the area is formed, and the pixel electrode is formed by jetting a transparent conductive material in the area.

* * * * *